(12) United States Patent
Lee et al.

(10) Patent No.: US 9,953,201 B2
(45) Date of Patent: Apr. 24, 2018

(54) BIOMETRIC RECOGNITION APPARATUS WITH DEFLECTION ELECTRODE

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 50 days.

(21) Appl. No.: 15/147,370

(22) Filed: May 5, 2016

(65) Prior Publication Data
US 2016/0342823 A1    Nov. 24, 2016

(30) Foreign Application Priority Data
May 21, 2015    (TW) .............................. 104116341 A

(51) Int. Cl.
*G06K 9/00*    (2006.01)
*H03K 17/96*    (2006.01)
*H05K 1/16*    (2006.01)

(52) U.S. Cl.
CPC ....... *G06K 9/0002* (2013.01); *H03K 17/9622* (2013.01); *H03K 2217/96023* (2013.01); *H03K 2217/960765* (2013.01); *H05K 1/162* (2013.01); *H05K 2201/10151* (2013.01)

(58) Field of Classification Search
USPC ....................................................... 382/124
See application file for complete search history.

(56) References Cited

U.S. PATENT DOCUMENTS

| 9,704,012 | B2* | 7/2017 | Kravets | G06K 9/0002 |
| 2009/0146967 | A1* | 6/2009 | Ino | G02F 1/133526 |
| | | | | 345/173 |
| 2009/0159901 | A1* | 6/2009 | Ikeda | G02F 1/1362 |
| | | | | 257/84 |
| 2012/0327347 | A1* | 12/2012 | Cho | G02F 1/1339 |
| | | | | 349/138 |
| 2016/0342823 | A1* | 11/2016 | Lee | G06K 9/0002 |
| 2017/0176795 | A1* | 6/2017 | Ro | G02F 1/13318 |
| 2017/0213065 | A1* | 7/2017 | Kurasawa | G06K 9/0002 |

* cited by examiner

*Primary Examiner* — Jerome Grant, II
(74) *Attorney, Agent, or Firm* — Chun-Ming Shih; HDLS IPR Services

(57) ABSTRACT

A biometric recognition apparatus with deflection electrode includes a substrate, a multi-function electrode layer including a plurality of sensing electrodes, a plurality of deflection electrodes and at least one suppressing electrode. Each of the sensing electrodes is at least partially surrounded by a corresponding deflection electrode and each of the deflection electrodes is at least partially surrounded by the suppressing electrode. The biometric recognition apparatus further includes a switching circuit layer having a plurality of selection switches and conductive wires, at least a part of the selection switches and the conductive wires are electrically connected to the sensing electrodes. By above arrangement of the sensing electrodes, the deflection electrodes and the suppressing electrode, the sensing sensibility and signal to noise ratio can be enhanced, thus increasing the sensing distance between sensing electrode and user finger.

21 Claims, 13 Drawing Sheets

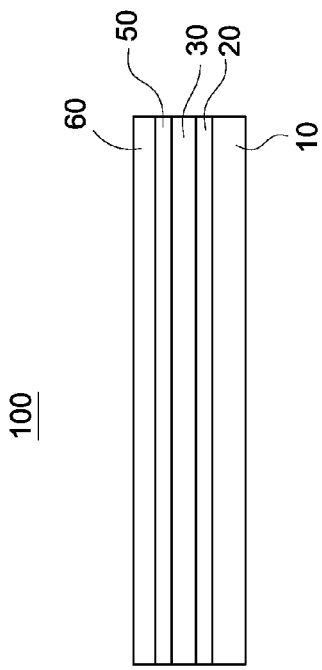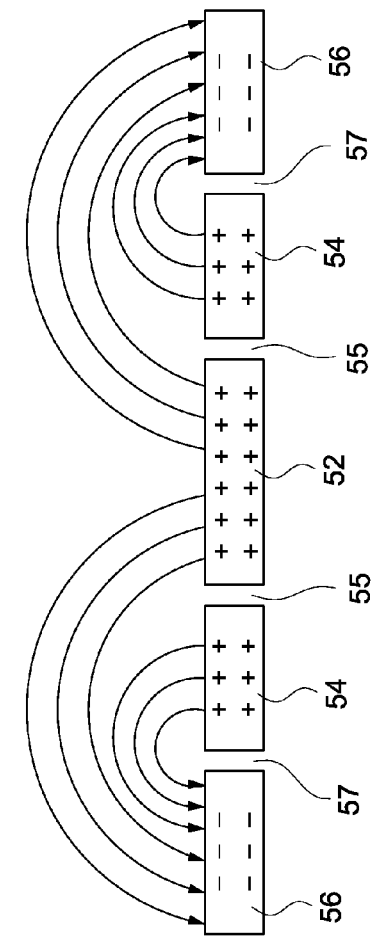
FIG.3A
FIG.3B

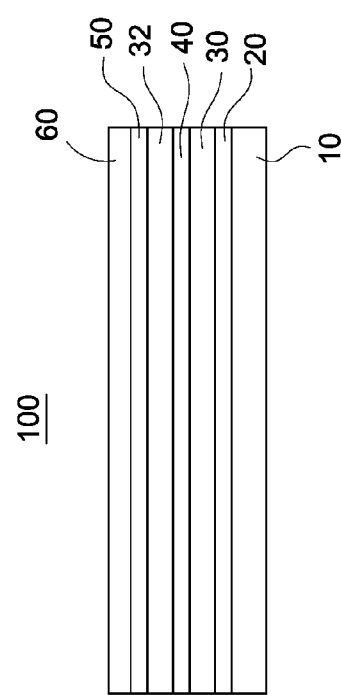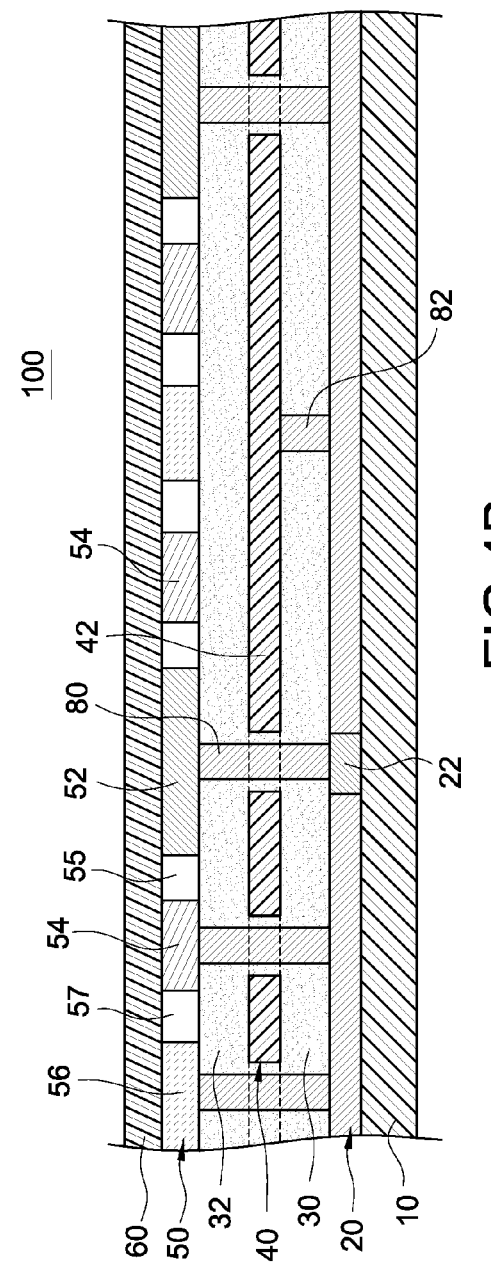
FIG.4A
FIG.4B

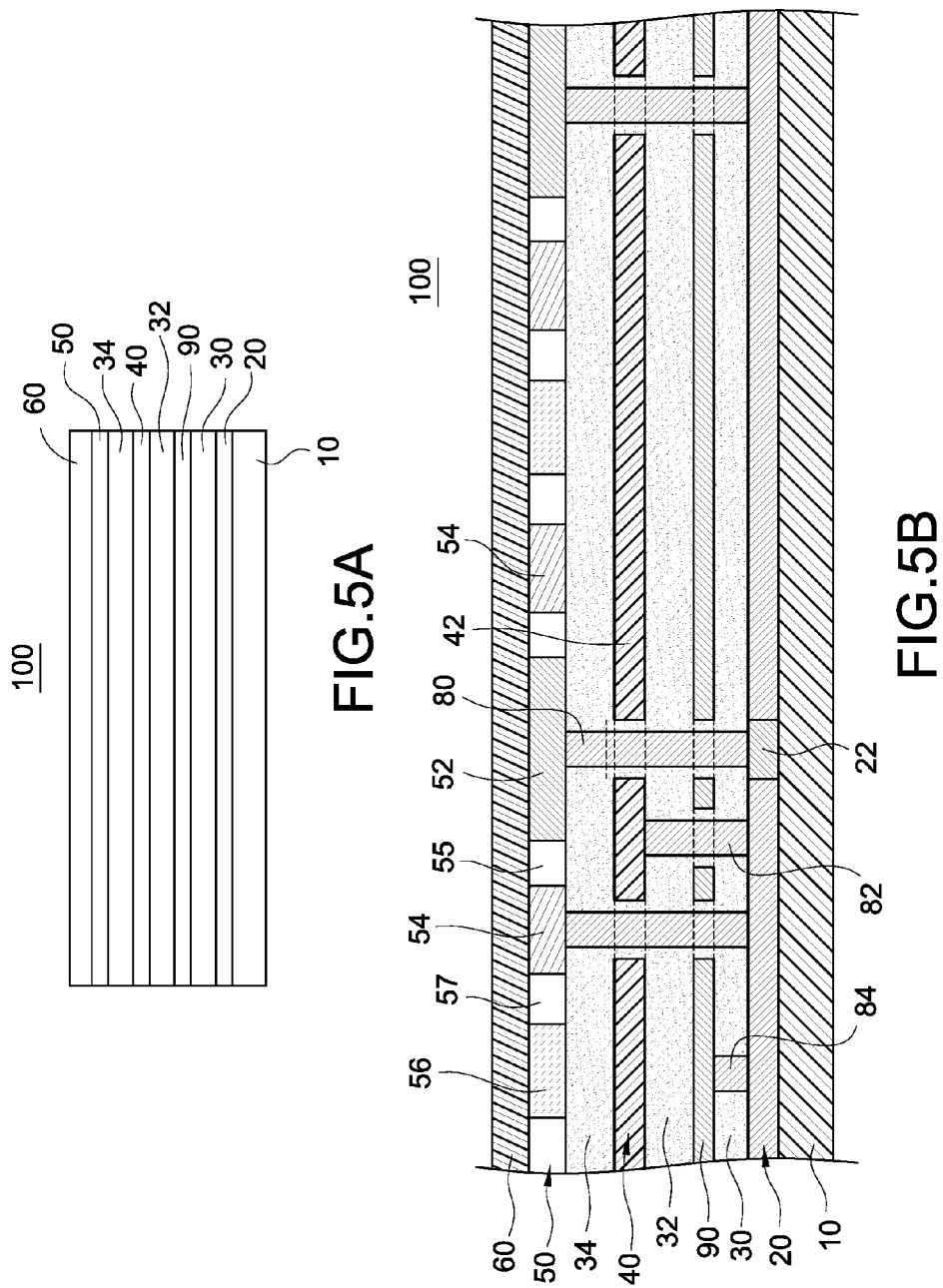

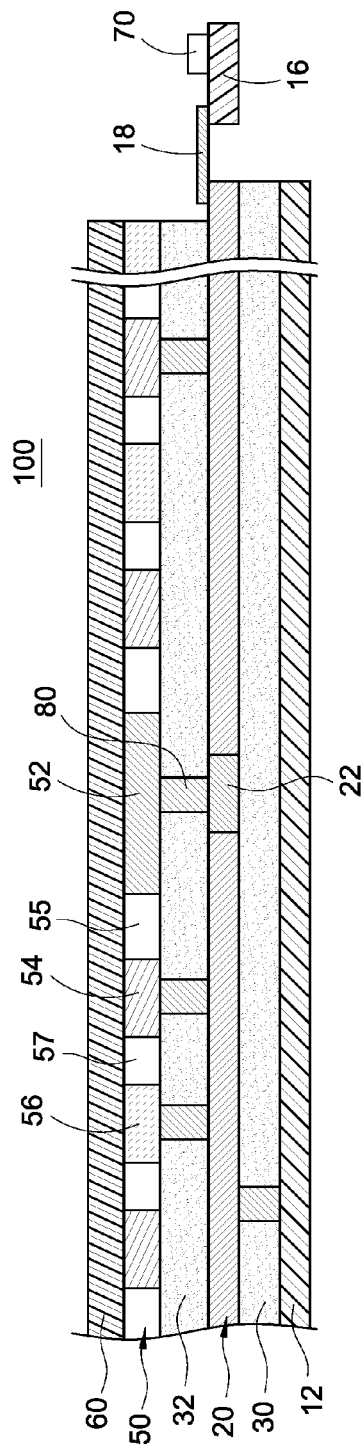
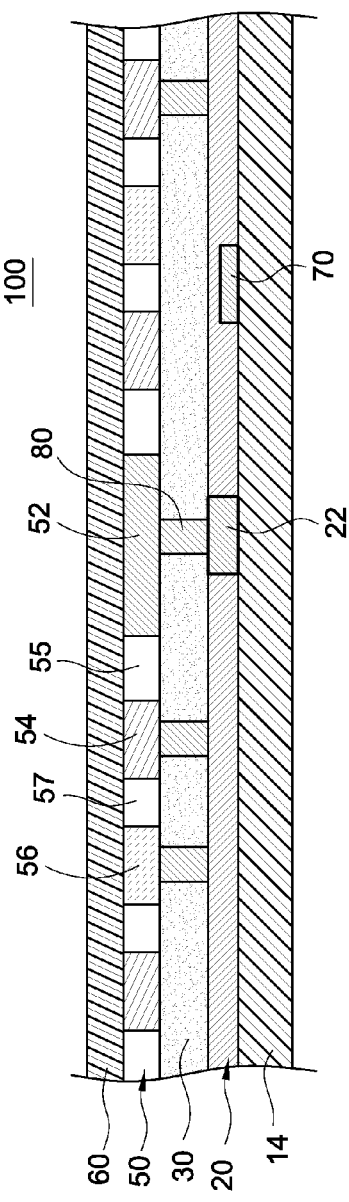
FIG.6B
FIG.6C

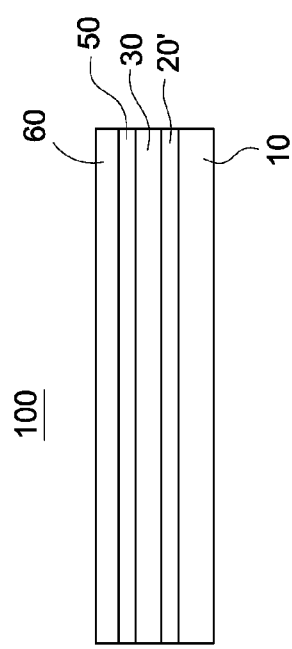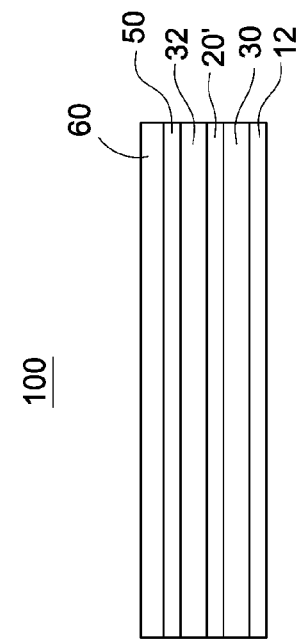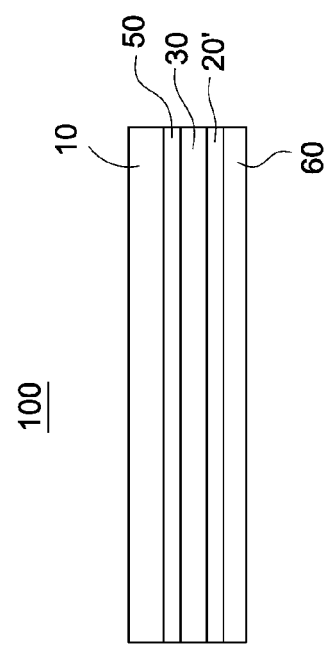

BIOMETRIC RECOGNITION APPARATUS WITH DEFLECTION ELECTRODE

BACKGROUND OF THE INVENTION

Field of the Invention

The present invention relates to a biometric recognition apparatus, especially to a biometric recognition apparatus with deflection electrode.

Description of Prior Art

Biometric recognition technology has been widely applied to personal identification and authentication. The conventional biometric recognition technologies can be classified into fingerprint recognition, iris recognition or DNA recognition and so on. Due to safety, non-invasiveness and efficiency considerations, fingerprint recognition becomes main stream technology. The fingerprint recognition device can scan fingerprint image by optical scanning, thermal imaging, supersonic imaging or capacitive imaging. For compactness, cost, power-saving, reliability and security concerns, the capacitive fingerprint sensor becomes popular for biometric recognition technology applied to portable electronic devices.

The conventional capacitive fingerprint sensors can be classified into swipe type and area type (pressing type), and the area type has better identification correctness, efficiency and convenience. However, the area type capacitive fingerprint sensor generally integrates the sensing electrodes and the sensing circuit into one integrated circuit (IC) protected by a sapphire film with thickness below 100 um because the sensed signals are minute and the background noise is huge in comparison with the minute sensed signals. As a result, the material cost and package cost is high and the product lifetime and durability are influenced. It is a development trend to enhance the sensing sensibility and signal-to-noise ratio for the sensing circuit such that the distance between the sensing electrode and user finger can be increased and the package of the sensing IC can be simplified. It is also desirable to integrate the sensing electrode to location below the protection glass or even more desirable to integrate the sensing electrode into the display panel, thus greatly reducing cost and enhancing product lifetime and durability.

SUMMARY OF THE INVENTION

It is an object of the present invention to provide a biometric recognition apparatus to overcome above mentioned problems.

Accordingly, the present invention provides a biometric recognition apparatus comprising: a substrate; a multi-function electrode layer arranged on one side of the substrate, the multi-function electrode layer comprising a plurality of sensing electrodes, a plurality of deflection electrodes and at least one suppressing electrode, wherein each of the sensing electrodes is at least partially surrounded by a corresponding deflection electrode and each of the deflection electrodes is at least partially surrounded by the suppressing electrode; and a switching circuit layer having a plurality of selection switches and conductive wires, at least a part of the selection switches and a part of the conductive wires electrically connected to the corresponding sensing electrodes; wherein at least one of the deflection electrodes is applied with a deflection signal.

Moreover, the present invention provides a sensing method for a biometric recognition apparatus, the biometric recognition apparatus comprising a plurality of sensing electrodes, a plurality of deflection electrodes, at least one suppressing electrode, a plurality of selection switches and at least one signal processing circuit, each of the sensing electrodes being corresponding to a deflection electrode, the method comprising: controlling the selection switches to sequentially or randomly set at least one of the sensing electrode as a detecting electrode; generating a periodic or non-periodic fingerprint sensing signal and sending the fingerprint sensing signal to the selected detecting electrode to generate a sensed signal; using the signal processing circuit to process the sensed signal into a deflection signal having a same phase with the sensed signal; and generating a suppressing signal.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

FIG. 3A shows the sectional view of the layered structure for the biometric recognition apparatus according to the present invention.

FIG. 3B is a sectional view showing the function of the multi-function electrode layer for the biometric recognition apparatus according to the present invention.

FIG. 4A shows the sectional view of the biometric recognition apparatus according to another embodiment of the present invention.

FIG. 4B is a more detailed sectional view for embodiment in FIG. 4A.

FIG. 5A shows the sectional view of the biometric recognition apparatus according to still another embodiment of the present invention.

FIG. 5B is a more detailed sectional view for embodiment in FIG. 5A.

FIGS. 6A-6C show the detailed sectional views of the biometric recognition apparatus according to other embodiments of the present invention, FIGS. 7A-7C show the schematic sectional views of the biometric recognition apparatus according to other embodiments of the present invention.

DETAILED DESCRIPTION OF THE INVENTION

Figure 1A:
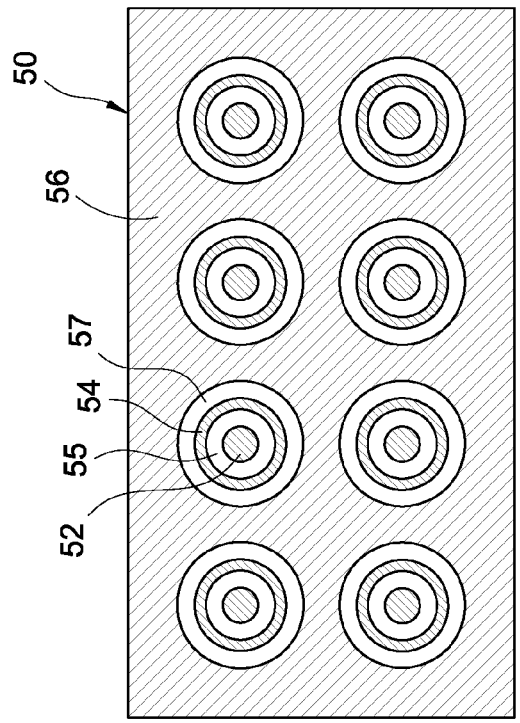
FIG. 1A is a top view showing the multi-function electrode layer in the biometric recognition apparatus according to an embodiment of the present invention.

FIG. 1A is a top view showing the multi-function electrode layer 50 in the biometric recognition apparatus 100 according to an embodiment of the present invention. The multi-function electrode layer 50 comprises a plurality of sensing electrodes 52, a plurality of deflection electrodes 54 and at least one suppressing electrode 56. Each of the sensing electrodes 52 is at least partially surrounded by a corresponding deflection electrode 54. Each of the deflection electrodes 54 is at least partially surrounded by the suppressing electrode 56 such that the sensing sensibility and signal-to-noise ratio can be enhanced. The deflection electrode 54 at least partially surrounds one corresponding sensing electrode 52 and electrically isolated with the surrounded sensing electrode 52. For example, the deflection electrode 54 may completely surround one corresponding sensing electrode 52 as shown in FIG. 1A. According to one embodiment, the sensing electrode 52 may be of rectangular shape and the corresponding deflection electrode 54 also has rectangular-strip shaped gap 55 therebetween. Moreover, the suppressing electrode 56 also has rectangular-strip shaped gap 57 between it and the corresponding deflection electrode 54. However, the sensing electrode 52 may be of other shapes such as triangular, square, oblong, rhombic or polygonal.

Figure 2A:
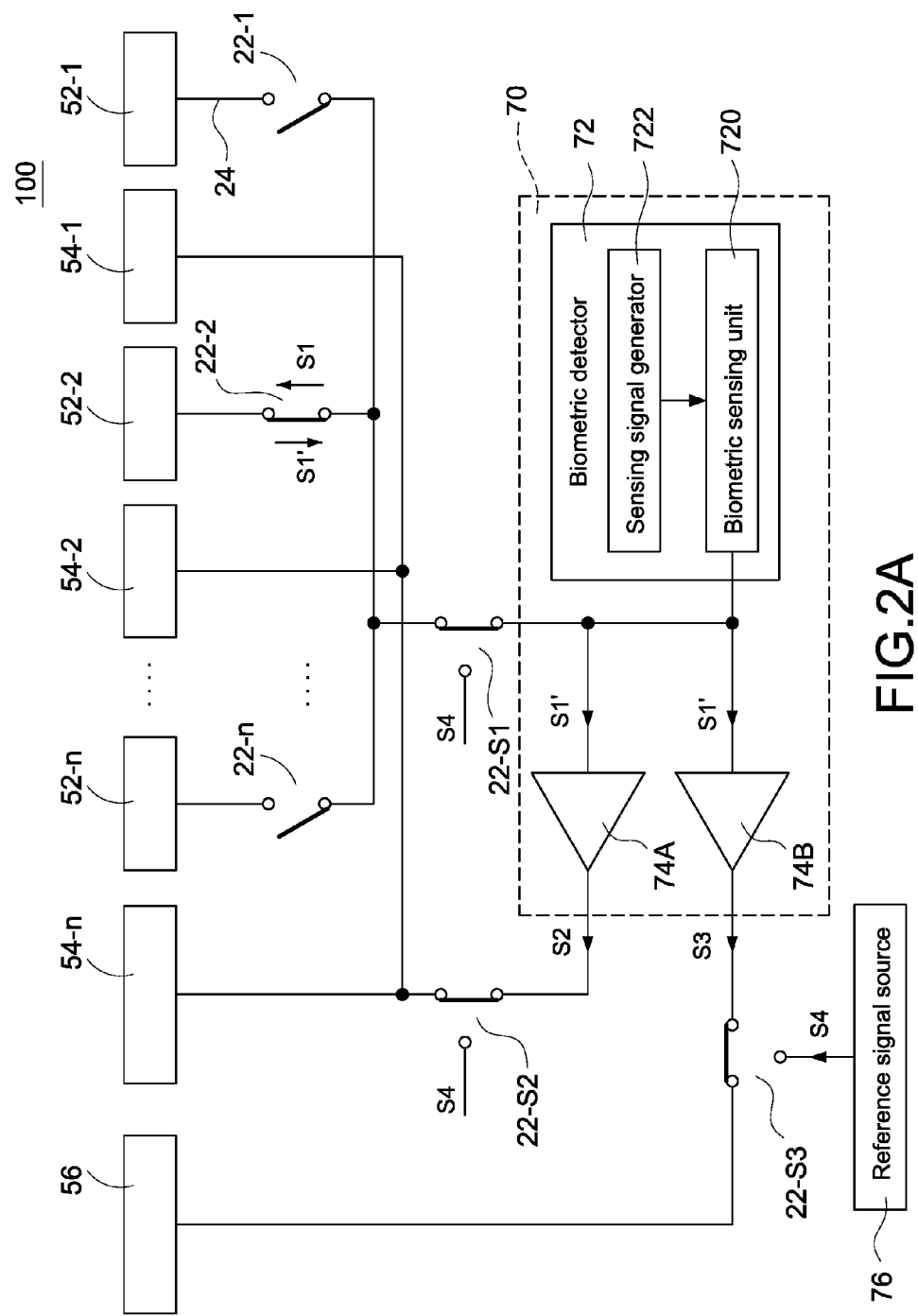
FIG. 2A is a schematic view showing the measurement operation of the biometric recognition apparatus according to an embodiment of the present invention.

FIG. 2A is a schematic view showing the measurement operation of the biometric recognition apparatus 100 according to an embodiment of the present invention. The sensing electrodes 52_1~52_n electrically connect with a plurality of selection switches 22_~22_n respectively through corresponding conductive wires 24, and then electrically connect with a biometric controller 70 through other conductive wires. The biometric controller 70 is preferably a self-capacitance sensing circuit. The deflection electrodes 54_1~54_n electrically connect with the biometric controller 70 through the conductive wires 24. A suppressing electrode 56 electrically connects with a selection switch 22_S3 through the conductive wire and then further electrically connects with the biometric controller 70. The biometric controller 70 comprises a biometric detector 72, a first signal processing circuit (such as a non-inverting amplifier) 74A and a second signal processing circuit (such as an inverting amplifier) 74B. The biometric detector 72 further comprises a biometric sensing unit 720 and a sensing signal generator 722. The biometric controller 70 selects one of the sensing electrodes 52 (such as the sensing electrode 52_2 shown in FIG. 2A) by controlling the selection switches 22. The sensing signal generator 722 generates a fingerprint sensing signal S1, which can be periodic sensing signal or a non-periodic sensing signal and then sends the signal to the selected sensing electrode 52_2 through the corresponding selection switch 22_2. The biometric sensing unit 720 receives a sensed signal S1' from the selected sensing electrode 52_2, and then sends the sensed signal S1' to the first signal processing circuit (such as a non-inverting amplifier) 74A for processing the sensed signal S1' into a deflection signal S2. The deflection signal S2 is then sent to all of the deflection electrodes 54_1~54_n. According to one embodiment, the sensed signal S1' is processed by the second signal processing circuit (such as an inverting amplifier) 74B into a suppressing signal S3, and then the suppressing signal S3 is sent to the suppressing electrode 56. Namely, the sensed signal S1' sensed by the selected sensing electrode 52_2 and the deflection signal S2 sent to the deflection electrodes 54_~54_n can be of the same phase (for example both of them are positive valued signals), while the suppressing signal S3 sent to the suppressing electrode 56 are of inverted phase with the sensed signal S1' and the deflection signal S2 (for example, the suppressing signal S3 is negative valued signal). With reference now to FIG. 3B, this figure shows the function of the multi-function electrode layer 50. As shown in this figure, a positive voltage is applied to the selected sensing electrode 52; positive voltages are applied to the deflection electrodes 54 while a negative voltage are applied to the suppressing electrode 56. The electric flux lines will be concentrated at a position atop the selected sensing electrode 52, which is corresponding to the user finger touch position. The interference from the electric flux lines atop the surrounding suppressing electrode 56 can be reduced for the selected sensing electrode 52 such that the sensing sensibility and signal-to-noise ratio can be enhanced. Besides, the sensing signal generator 722 can also generate periodic signal, non-periodic signal, symmetric or asymmetric signal, wherein the periodic signal can be sinusoid wave, square wave or triangular wave.

According to another embodiment, the suppressing electrode 56 may receive a predetermined-level signal S4 output by a reference signal source 76 through the selection switch 22_S3, where the predetermined-level signal S4 has smaller magnitude than that of the sensed signal S1'. The predetermined-level signal S4 can be positive level signal, negative level signal, zero level signal or alternating signal. Similarly, the sensed signal S1' sensed by the selected sensing electrode 52_2 and the deflection signal S2 sent to the deflection electrodes 54_1~54_n can be of the same phase (for example both of them are positive valued signals with larger magnitude), while the suppressing signal S3 sent to the suppressing electrode 56 is also of the same phase with the sensed signal S1' and the deflection signal S2 but with smaller magnitude (for example, the suppressing signal S3 is positive valued signal with smaller magnitude). With reference again to FIG. 3B, a positive voltage with larger magnitude is applied to the selected sensing electrode 52; positive voltages with larger magnitude are applied to the deflection electrodes 54 while a positive voltage with smaller magnitude is applied to the suppressing electrode 56. Similarly, the electric flux lines will be concentrated at a position atop the selected sensing electrode 52, which is corresponding to the user finger touch position. The interference from the electric flux lines atop surrounding suppressing electrode 56 can also be reduced for the selected sensing electrode 52 such that the sensing sensibility and signal-to-noise ratio can be enhanced. Moreover, the biometric controller 70 can also send the predetermined-level signal S4 to all sensing electrodes 52 (or the selected sensing electrode 52_2), the deflection electrodes 54 and the suppressing electrode 56 through the selection switches 22_S1~22_S3, where the predetermined-level signal S4 may be positive level signal, negative level signal, zero level signal or alternating signal.

Figure 2B:
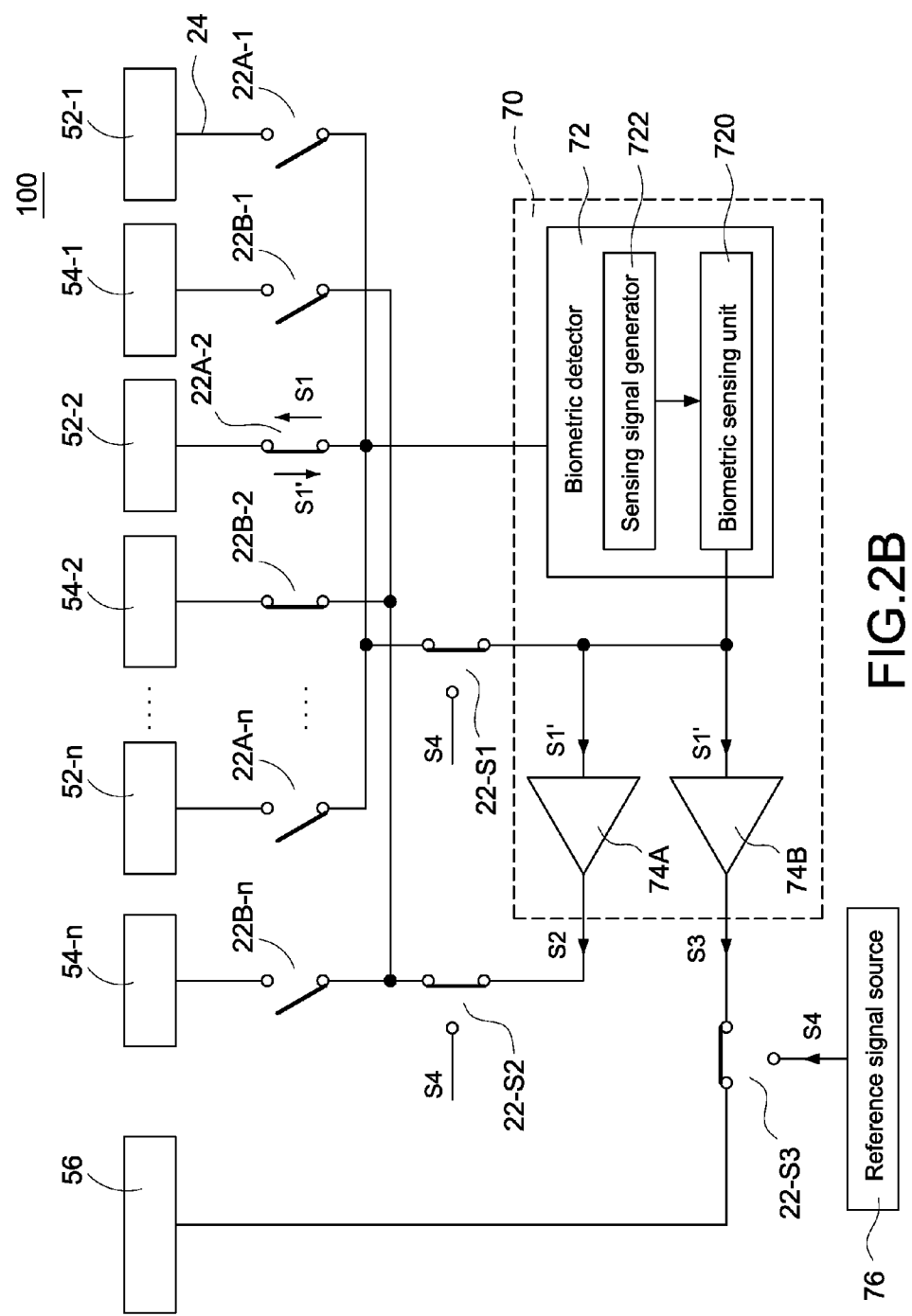
FIG. 2B is a schematic view showing the measurement operation of the biometric recognition apparatus according to another embodiment of the present invention.

FIG. 2B is a schematic view showing the measurement operation of the biometric recognition apparatus 100 according to another embodiment of the present invention. The embodiment is similar to that shown in FIG. 2A while each of the sensing electrodes 52_~52_n electrically connects with a corresponding one of the selection switches 22A_1~22A_n (the first set of selection switches), and each of the deflection electrodes 54_1~54_n electrically connects with a corresponding one of the selection switches 22B_1~22B_n (the second set of selection switches). Similarly, the biometric controller 70 selects one of the sensing electrodes 52 (such as the sensing electrode 52_2 shown in FIG. 2B) by controlling the first set of selection switches 22A and selects one of the deflection electrodes 54 (such as the deflection electrode 54_2 shown in FIG. 2B) by controlling the second set of selection switches 22B.

The sensing signal generator 722 generates a fingerprint sensing signal S1, which can be periodic sensing signal or a non-periodic sensing signal and then sends the signal to the sensing electrode 52_2 through the corresponding selection switch 22A_2. The biometric sensing unit 720 receives a sensed signal S1' from the sensing electrode 52_2 and then sends the sensed signal S1' to the first signal processing circuit (such as a non-inverting amplifier) 74A for processing the sensed signal S1' into a deflection signal S2. The deflection signal S2 is then sent to the selected (corresponding) deflection electrode 54_2 through the corresponding selection switch 22B_2. According to one embodiment, the sensed signal S1' is processed by the second signal processing circuit (such as an inverting amplifier) 74B into a suppressing signal S3, and then the suppressing signal S3 is sent to the suppressing electrode 56. Namely, the sensed signal S1' sensed by the selected sensing electrode 52_2 and the deflection signal S2 sent to the deflection electrode 54_2 can be of the same phase (for example both of them are positive valued signals), while the suppressing signal S3 sent to the suppressing electrode 56 is of inverted phase with the sensed signal S1' and the deflection signal S2 (for example, the suppressing signal S3 is negative valued signal). With reference to FIG. 3B, a positive voltage is applied to the selected sensing electrode 52; positive voltages are applied to the deflection electrodes 54 while negative voltage is applied to the suppressing electrode 56. The electric line will be concentrated at a position atop the selected sensing electrode 52, which is corresponding to the user finger touch position. The interference from the electric flux lines atop surrounding suppressing electrode 56 can be reduced for the selected sensing electrode 52 such that the sensing sensibility and signal-to-noise ratio can be enhanced. Besides, the sensing signal generator 722 can also generate periodic signal, non-periodic signal, symmetric or asymmetric signal, wherein the periodic signal can be sinusoid wave, square wave or triangular wave.

According to another embodiment, the suppressing electrode 56 may receive a predetermined-level signal S4 output by a reference signal source 76 through the selection switch 22_S3, where the predetermined-level signal S4 has smaller magnitude than that of the sensed signal S1'. The predetermined-level signal S4 can be positive level signal, negative level signal, zero level signal or alternating signal. Similarly, the sensed signal S1' sensed by the selected sensing electrode 52_2 and the deflection signal S2 sent to the deflection electrodes 54_1~54_n may be of the same phase (for example both of them are positive valued signals with larger magnitude), while the suppressing signal S3 sent to the suppressing electrode 56 is also of the same phase with the sensed signal S1' and the deflection signal S2 but with smaller magnitude (for example, the suppressing signal S3 is positive valued signal with smaller magnitude). With reference again to FIG. 3B, a positive voltage with larger magnitude is applied to the selected sensing electrode 52; positive voltages with larger magnitude are applied to the deflection electrodes 54 while positive voltage with smaller magnitude is applied to the suppressing electrode 56. Similarly, the electric flux lines will be concentrated at a position atop the selected sensing electrode 52, which is corresponding to the user finger touch position. The interference from the surrounding suppressing electrode 56 can be reduced for the selected sensing electrode 52 such that the sensing sensibility and signal-to-noise ratio can be enhanced. Moreover, the biometric controller 70 can also send the predetermined-level signal S4 to all sensing electrodes 52 (or the selected sensing electrode 52_2), the deflection electrodes 54 and the suppressing electrode 56 through the selection switches 22_S1~22_S3, where the predetermined-level signal S4 may be positive level signal, negative level signal, zero level signal or alternating signal.

Figure 1B:
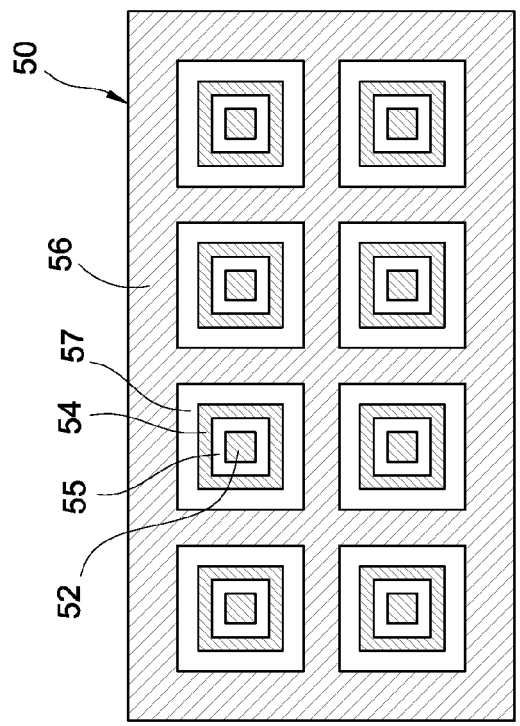
FIG. 1B is a top view showing the multi-function electrode layer in the biometric recognition apparatus according to another embodiment of the present invention.
Figure 3C:
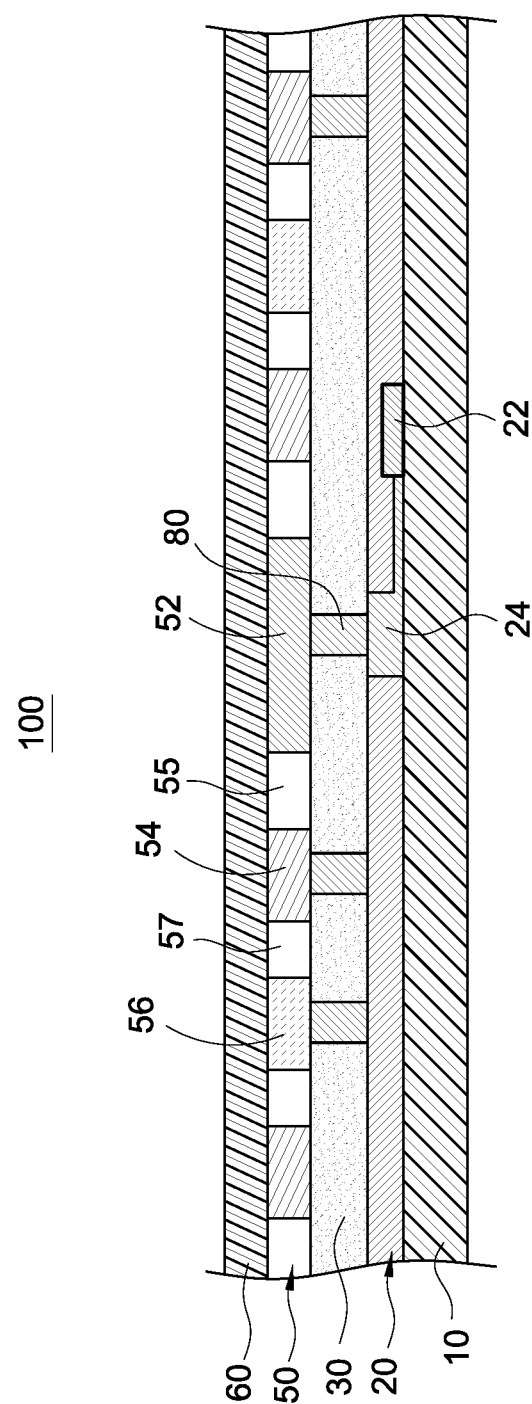
FIG. 3C shows the sectional view of the detailed structure for the biometric recognition apparatus according to the present invention.
Figure 3D:
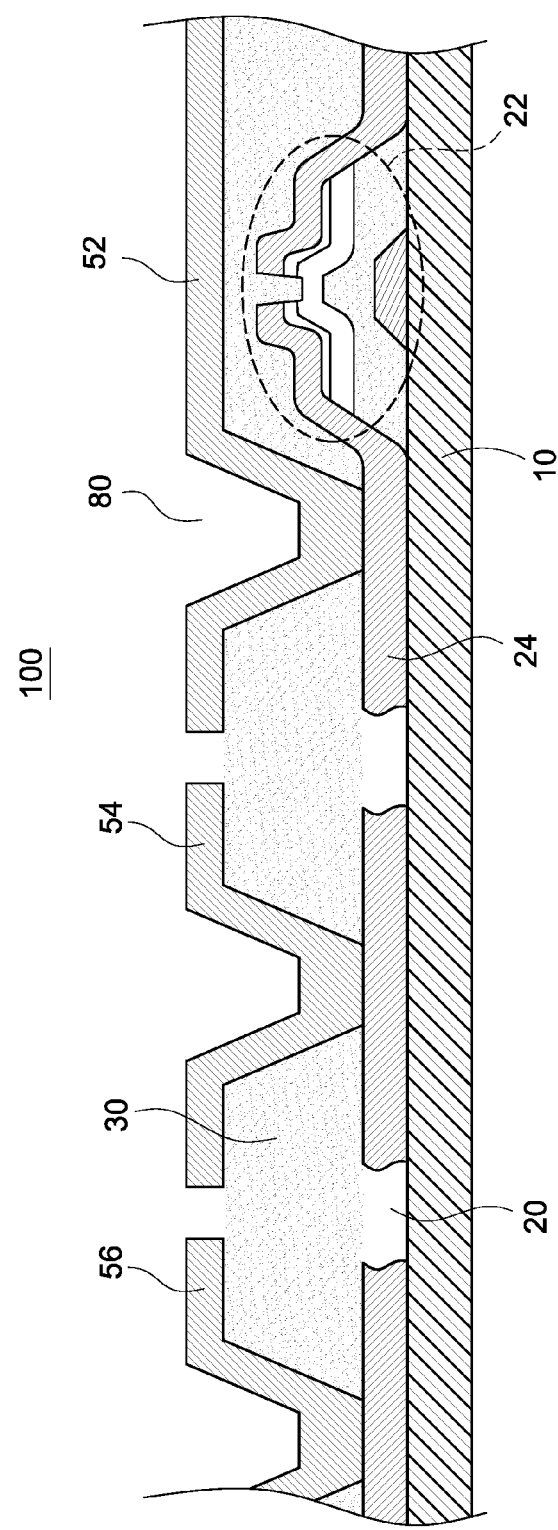
FIG. 3D shows the sectional view of the device structure for the biometric recognition apparatus according to the present invention.

FIGS. 3A to 3D show the sectional views of the layered structure for the biometric recognition apparatus, the function of the multi-function electrode layer, the detailed structure for the biometric recognition apparatus, and the device structure for the biometric recognition apparatus according to the present invention. As shown in FIG. 3A, the biometric recognition apparatus 100 according to an embodiment of the present invention comprises, from bottom to top order, a substrate 10, a switching circuit layer 20, an insulating layer 30, a multi-function electrode layer 50 and a protection layer 60. In the shown multi-layer structure, the switching circuit layer 20 comprises a plurality of selection switches 22 and a plurality of conductive wires 24, which can be referred to those shown in FIGS. 2A and 2B. The multi-function electrode layer 50 may have the plurality of sensing electrodes 52, the plurality of deflection electrodes 54 and the least one suppressing electrode 56 as shown in FIG. 1A or FIG. 1B, which may be arranged on the same plane. The switching circuit layer 20 and the multi-function electrode layer 50 each has respective conductive wires and electrodes, therefore, the insulating layer 30 is arranged therebetween to provide electric isolation. With reference to FIG. 3C, the switching circuit layer 20 comprises a plurality of selection switches 22 and a plurality of conductive wires 24, where each of the conductive wires 24 electrically connects with respect one of the sensing electrodes 52, the deflection electrodes 54 and the suppressing electrode 56 through the via hole 80 in the insulating layer 30. Moreover, as shown in FIG. 3D, the selection switch 22 may be thin film transistor (TFT) switch 22 and electrically connects with corresponding sensing electrode 52 through the corresponding conductive wire 24 and the corresponding via hole 80. Even not shown in FIG. 3D, the deflection electrode 54 electrically connects with corresponding selection switch 22 through the corresponding conductive wire 24 and the corresponding via hole 80. Similarly, the suppressing electrode 56 also electrically connects with corresponding selection switch 22 through the corresponding conductive wire and the corresponding via hole. In the biometric recognition apparatus 100 shown in FIGS. 3A and 3C, the protection layer 60 can provide the function of anti-oxidation, anti-moisture and scratch proof.

In the embodiments shown in FIGS. 3A, 3C, 3D, the substrate 10 may be made from glass, polymer thin film, metal, silicon or silicon compound. The metal substrate may be made from stainless steel, aluminum (Al), copper (Cu), iron (Fe), silver (Ag), tin (Sn), tungsten (W) or the alloy of above metals. The sensing electrodes 52, the deflection electrodes 54 and the suppressing electrode 56 may be made from transparent or non-transparent (opaque) conductive material. The transparent conductive material includes indium tin oxide (ITO), zinc tin oxide (ZTO), zinc oxide (ZnO), gallium zinc oxide (GZO) conductive polymer, carbon nanotube, Graphene, or silver film with thickness below 50 nm. According to one aspect of the present invention, the opaque conductive material is chromium (Cr), barium (Ba), molybdenum (Mo), aluminum (Al), silver (Ag), copper (Cu), titanium (Ti), nickel (Ni), tantalum (Ta), cobalt (Co), tungsten (W), magnesium(Mg), calcium (Ca), potassium (K), lithium (Li), indium (In), an alloy of above metals, or a composition of lithium fluoride and Al, or a composition of magnesium fluoride and Al, or a composition of lithium oxide and Al.

FIG. 4A shows the sectional view of the biometric recognition apparatus 100 according to another embodiment of the present invention, this embodiment is similar to that shown in FIG. 3A and therefore uses the similar numerals as those in FIG. 3A. The biometric recognition apparatus 100 further comprises a reflection shielding electrode layer 40 arranged between the switching circuit layer 20 and the multi-function electrode layer 50 to provide enhanced noise-shielding function for the conductive wires and the sensing electrodes. To provide electric isolation among the switching circuit layer 20, the reflection shielding electrode layer 40 and the multi-function electrode layer 50, a first insulating layer 30 is provided between the switching circuit layer 20 and the reflection shielding electrode layer 40, a second first insulating layer 32 is provided between the reflection shielding electrode layer 40 and the multi-function electrode layer 50. As shown in FIG. 4B, the sensing electrodes 52, the deflection electrodes 54 and the suppressing electrode 56 respectively and electrically connects with corresponding selection switch 22 and corresponding conductive wire (not shown) through the corresponding via hole 80. Moreover, the reflection shielding electrodes 42 on the reflection shielding electrode layer 40 respectively and electrically connects with corresponding selection switch 22 and corresponding conductive wire (not shown) through the corresponding via hole 82.

FIG. 5A shows the sectional view of the biometric recognition apparatus 100 according to another embodiment of the present invention, and FIG. 5B is a more detailed view for FIG. 5A. The biometric recognition apparatus 100 shown in FIG. 5A further comprises a shielding electrode layer 90 between the switching circuit layer 20 and the reflection shielding electrode layer 40 to provide enhance noise-shielding effect for the conductive wires and the sensing electrode. To provide electric isolation among the switching circuit layer 20, the shielding electrode layer 90, the reflection shielding electrode layer 40 and the multi-function electrode layer 50, three insulating layers 30, 32, 34 are respectively provided between two adjacent layers in abovementioned four layers. As shown in FIG. 5B, the sensing electrodes 52, the deflection electrodes 54 and the suppressing electrode 56 respectively and electrically connects with corresponding selection switch 22 and corresponding conductive wire (not shown) through the corresponding via hole 80. Moreover, the reflection shielding electrodes 42 on the reflection shielding electrode layer 40 respectively and electrically connects with corresponding selection switch 22 and corresponding conductive wire (not shown) through the corresponding via hole 82; and the shielding electrode 92 on the shielding electrode layer 90 electrically connects with corresponding selection switch 22 and corresponding conductive wire (not shown) through the corresponding via hole 84.

Figure 6A:
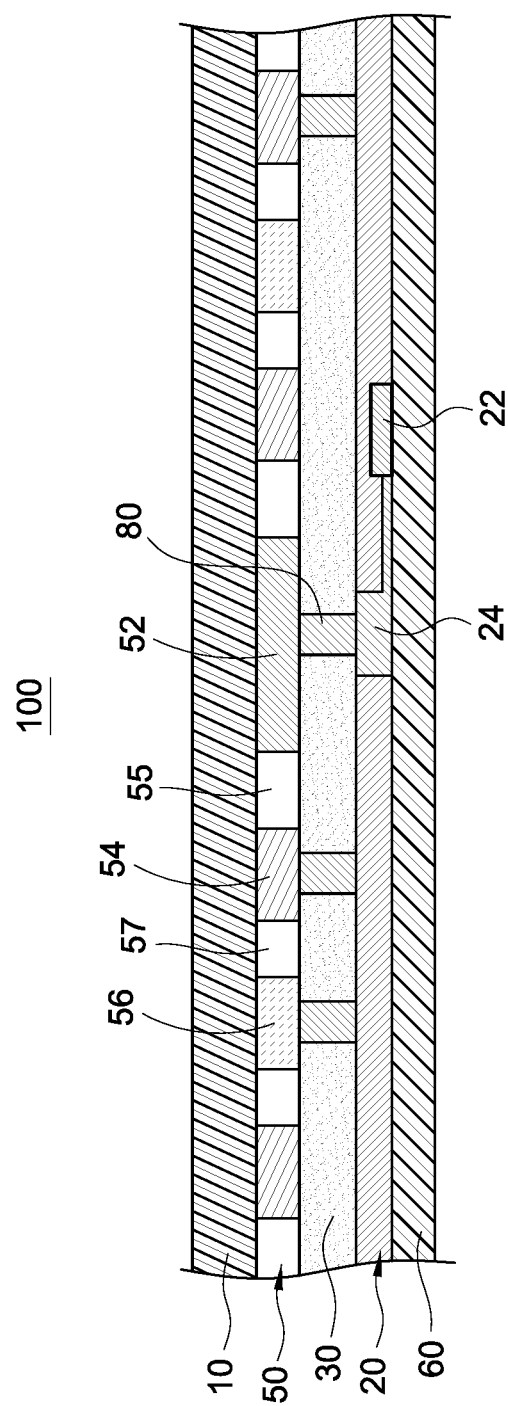

FIG. 6A shows the sectional view of the biometric recognition apparatus 100 according to another embodiment of the present invention, wherein the embodiment shown in FIG. 6A is similar to that shown in FIG. 3A and similar elements use the similar numerals. In comparison with the embodiment shown in FIG. 3A, the protection layer 60 in the biometric recognition apparatus 100 shown in FIG. 6A is arranged on bottommost position of the structure, while the substrate 10 is arranged on topmost position of the structure. The substrate 10 is, for example, glass substrate to provide scratchproof effect. Moreover, the protection layer 60 has broader material choice because it does not need to have scratchproof effect. The protection layer 60 may be an extension of the substrate of other device.

FIG. 6B shows the sectional view of the biometric recognition apparatus 100 according to another embodiment of the present invention, wherein the embodiment shown in FIG. 6B is similar to that shown in FIG. 3A and similar elements use the similar numerals. The substrate 12 in embodiment shown in FIG. 6B is metal substrate and metal substrate may be made from stainless steel, aluminum (Al), copper (Cu), iron (Fe), silver (Ag), tin (Sn), tungsten (W) or the alloy of above metals. Moreover, the biometric controller 70 may be packaged into an integrated circuit (IC) chip and the IC chip is bonded or press-welded on the metal substrate 12. As shown in FIG. 6B, the biometric controller 70 packaged in IC chip may be bonded or press-welded on a circuit board 16 and electrically connect with the conductive wires of the metal substrate 12 through circuit traces (not shown) on a flexible circuit board 18. In this embodiment, the selection switch 22 may be a TFT switch and grown on the metal substrate 12.

FIG. 6C shows the sectional view of the biometric recognition apparatus 100 according to another embodiment of the present invention, wherein the embodiment shown in FIG. 6C is similar to that shown in FIG. 3A and similar elements use the similar numerals. The substrate 14 in embodiment shown in FIG. 6C is silicon substrate and biometric controller 70 may be formed by IC fabrication process on the switching circuit layer 20. Therefore, the biometric recognition apparatus 100 may be formed into single IC. Moreover, the protection layer 60 may be IC packaging material such as ceramic or sapphire material. In this embodiment, the selection switch 22 may be an FET switch and grown on the silicon substrate 14.

FIGS. 7A to 7C show the sectional views of the biometric recognition apparatus 100 according to other embodiments of the present invention. The embodiment shown in FIG. 7A is similar to that shown in FIG. 3A and similar elements use the similar numerals. In the embodiment shown in FIG. 7A, the reflection shielding electrode is arranged on spare area of the switching circuit layer 20'. Therefore, the sensing electrode and conductive wires above the switching circuit layer 20' has better EMI shielding effect.

The embodiment shown in FIG. 7B is similar to that shown in FIG. 7A and similar elements use the similar numerals. The protection layer 60 in the biometric recognition apparatus 100 shown in FIG. 7B is arranged on bottommost position and the substrate 10 in the biometric recognition apparatus 100 shown in FIG. 7B is arranged on topmost position. The substrate 10 is, for example, glass substrate to provide scratchproof effect. Moreover, the protection layer 60 has broader material choice because it does not need to have scratchproof effect. The protection layer 60 may be an extension of the substrate of other device.

The embodiment shown in FIG. 7C is similar to that shown in FIG. 7A and similar elements use the similar numerals. The substrate 12 in embodiment shown in FIG. 7C is metal substrate and metal substrate may be made from stainless steel, aluminum (Al), copper (Cu), iron (Fe), silver (Ag), tin (Sn), tungsten (W) or the alloy of above metals. Moreover, the metal substrate 12 can electrically connect with another IC such as the biometric controller 70 shown in FIG. 2A. Besides, two insulation layers 30 and 32 are provided in this embodiment to electrically isolate the metal substrate 12, the switching circuit layer 20' and the multi-function electrode layer 50.

Figure 8A:
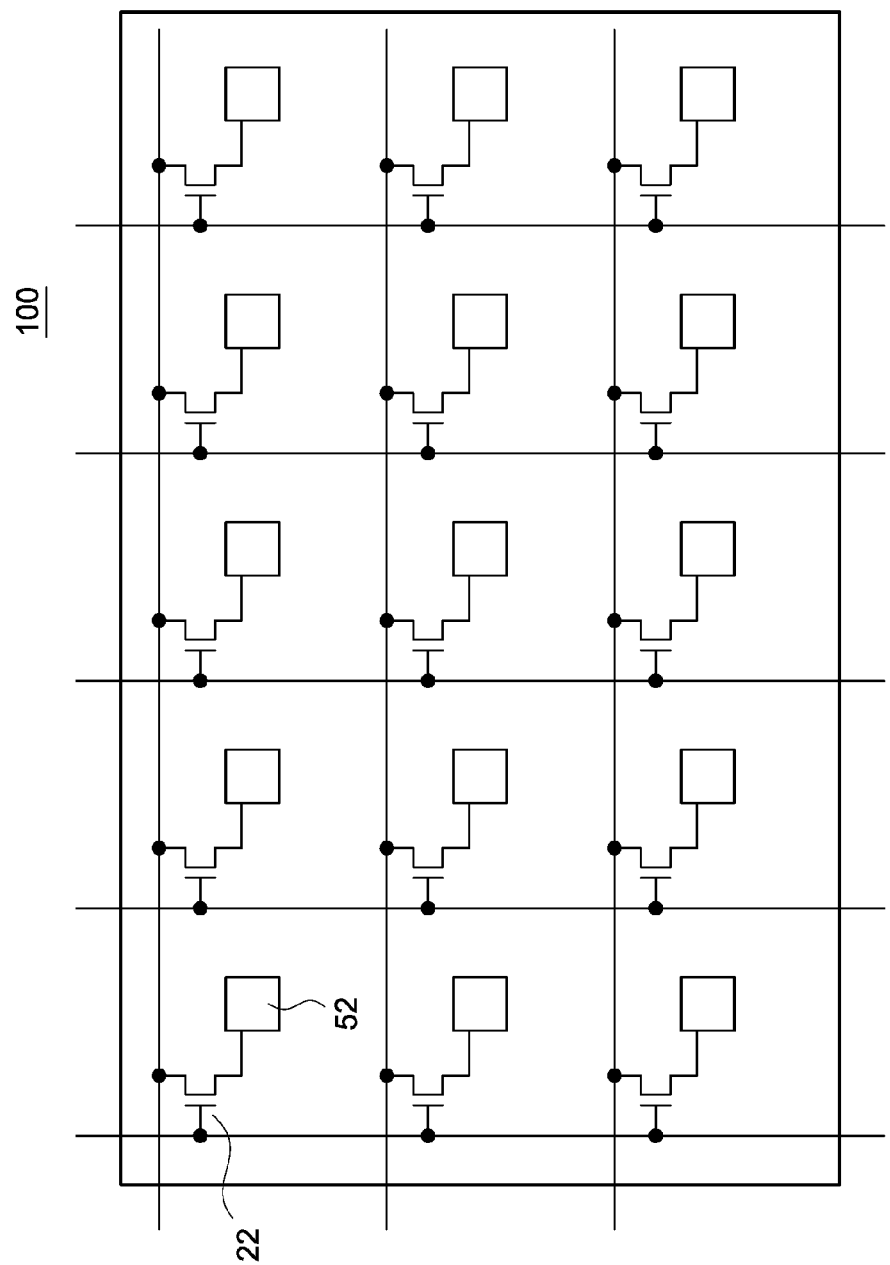
FIG. 8A is a schematic view showing the measurement operation of the biometric recognition apparatus according to the present invention.

FIG. 8A is a schematic view showing the measurement operation of the biometric recognition apparatus 100 according to the present invention, where the biometric recognition apparatus 100 is, for example, the biometric recognition apparatus 100 shown in FIG. 2A. Namely, all of the deflection electrodes 54 are applied with the deflection signal S2 while the sensing electrodes 52 are selectively applied with the sensing signal S1 through the corresponding selection switches 22.

Figure 8B:
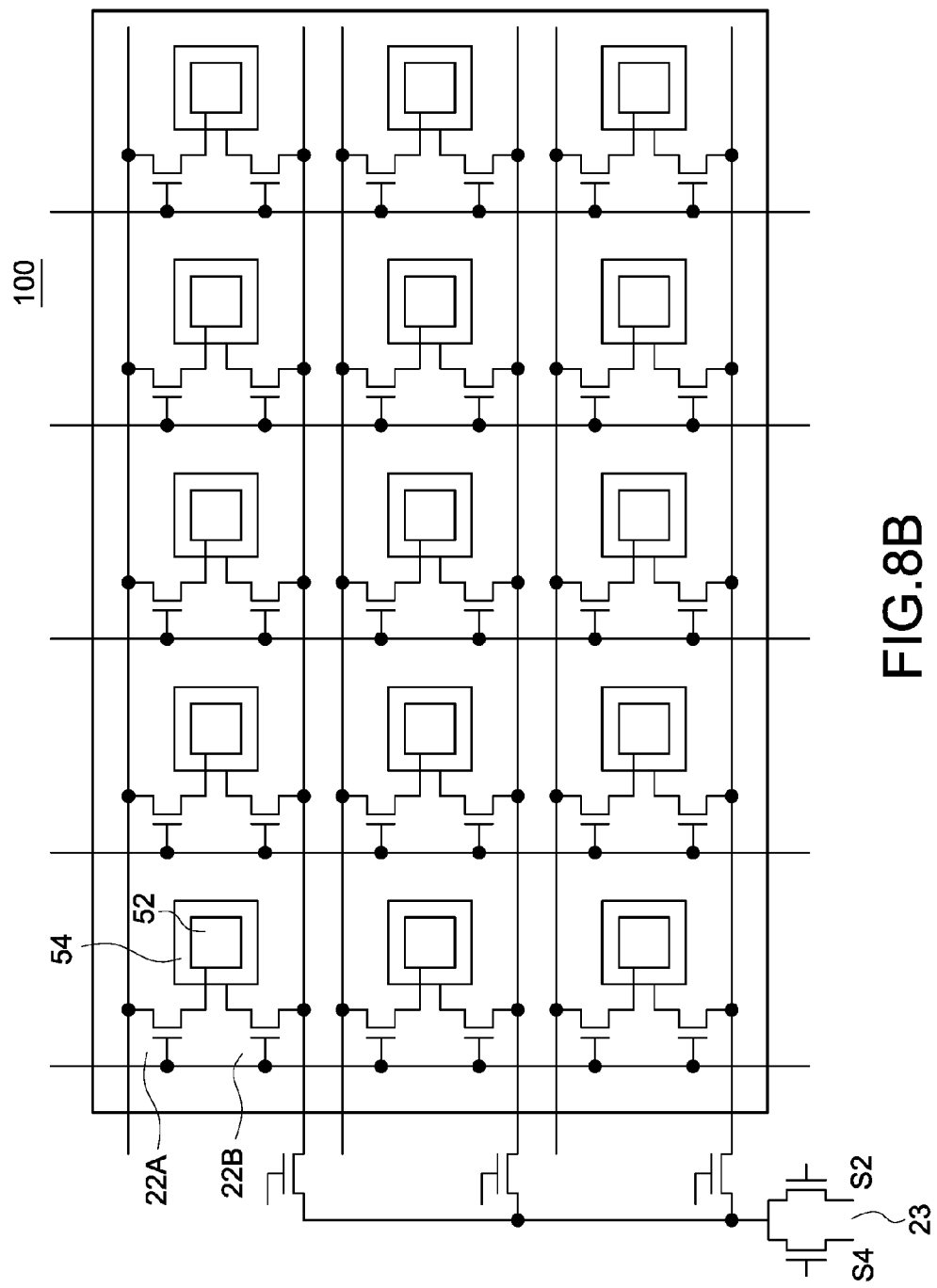
FIG. 8B is a schematic view showing the measurement operation of the biometric recognition apparatus according to the present invention.

FIG. 8B is a schematic view showing the measurement operation of the biometric recognition apparatus 100 according to the present invention, where the biometric recognition apparatus 100 is, for example, the biometric recognition apparatus 100 shown in FIG. 2B. Namely, the deflection electrodes 54 are selectively applied with the deflection signal S2 or the predetermined-level signal S4 through the second set of selection switches 22B and the signal selection switch 23. The sensing electrodes 52 are selectively applied with the sensing signal S1 through the first set of selection switches 22A. The deflection signal S2 is, for example, generated by the first signal processing circuit (such as a non-inverting amplifier) 74A shown in FIG. 2B, while the predetermined-level signal S4 is, for example, generated by the reference signal source 76 shown in FIG. 2B.

To sum up, the present invention has following advantages:

1. The sensing electrode has deflection electrode surrounding and electrically isolated with the sensing electrode, and the deflection electrode has suppressing electrode surrounding and electrically isolated with the deflection electrode. When applying a suitable deflection signal to the deflection electrode, the sensing ability and signal-to-noise ratio for the sensing circuit can be enhanced and the distance between the sensing electrode and user finger can be advantageously increased.

2. When respectively applying sensing signal, deflection signal and suppressing signal to the sensing electrode, the deflection electrode and the suppressing electrode, the electric flux lines can be concentrated on a position atop the selected sensing electrode, which is corresponding to the user finger touch position. Therefore, the interference from the electric flux lines located atop circumference of the sensing electrode can be suppressed, thus further enhancing the sensing ability and signal-to-noise ratio.

3. The sensing electrode according to the present invention can be implemented in integrated circuit as well as substrates (such as metal, polymer thin film or glass) not for integrated circuit. The chip area and manufacture cost can be reduced.

Thus, particular embodiments have been described. Other embodiments are within the scope of the following claims. For example, the actions recited in the claims may be performed in a different order and still achieve desirable results.

What is claimed is:

1. A biometric recognition apparatus comprising:
   a substrate,
   a multi-function electrode layer arranged on one side of the substrate, the multi-function electrode layer comprising a plurality of sensing electrodes, a plurality of deflection electrodes and at least one suppressing electrode, wherein each of the sensing electrodes is at least partially surrounded by a corresponding deflection electrode and each of the deflection electrodes is at least partially surrounded by the suppressing electrode; and
   a switching circuit layer having a plurality of selection switches and conductive wires, at least a part of the selection switches and a part of the conductive wires electrically connected to the corresponding sensing electrodes;
   wherein at least one of the deflection electrodes is applied with a deflection signal.

2. The biometric recognition apparatus in claim 1, further comprising an insulating layer arranged on one side of the switching circuit layer toward the multi-function electrode layer.

3. The biometric recognition apparatus in claim 2, further comprising a reflection shielding electrode layer arranged between the multi-function electrode layer and the switching circuit layer, the reflection shielding electrode layer comprises at least one reflection shielding electrode.

4. The biometric recognition apparatus in claim 3, further comprising another insulating layer arranged on one side of the reflection shielding electrode layer toward the multi-function electrode layer.

5. The biometric recognition apparatus in claim 1, wherein the selection switches are arranged into a plurality of switch sets, each of the selection switches in one switch set is corresponding to at least one of the sensing electrodes.

6. The biometric recognition apparatus in claim 5, wherein each of the conductive wires electrically couples to at least one of the switch sets.

7. The biometric recognition apparatus in claim 1, wherein the selection switch is field effect transistor (FET) switch.

8. The biometric recognition apparatus in claim 7, wherein the FET switch is arranged on the substrate.

9. The biometric recognition apparatus in claim 7, further comprising a biometric controller formed atop the substrate.

10. The biometric recognition apparatus in claim 1, wherein the selection switch is thin film transistor (TFT) switch.

11. The biometric recognition apparatus in claim 10, wherein the TFT switch is arranged on the substrate.

12. The biometric recognition apparatus in claim 1, further comprising a biometric controller packaged into an integrated circuit (IC) chip, the IC chip is bonded or press-welded on the substrate.

13. The biometric recognition apparatus in claim 1, further comprising a biometric controller packaged into an integrated circuit (IC) chip, the IC chip is bonded or press-welded on a circuit board and the IC chip electrically connects with the substrate through a flexible circuit board.

14. The biometric recognition apparatus in claim 1, wherein the substrate is made from glass, polymer thin film, metal, silicon or silicon compound.

15. The biometric recognition apparatus in claim 1, further comprising a biometric controller configured to send the deflection signal to the deflection electrode.

16. A sensing method for a biometric recognition apparatus, the biometric recognition apparatus comprising a plurality of sensing electrodes, a plurality of deflection electrodes, at least one suppressing electrode, a plurality of selection switches and at least one signal processing circuit, each of the sensing electrodes being corresponding to a deflection electrode, the method comprising:
   controlling the selection switches to sequentially or randomly set at least one of the sensing electrode as a detecting electrode;
   generating a periodic or non-periodic fingerprint sensing signal and sending the fingerprint sensing signal to the selected detecting electrode to generate a sensed signal;

using the signal processing circuit to process the sensed signal into a deflection signal having a same phase with the sensed signal; and generating a suppressing signal.

17. The method in claim 16, further comprising: coupling the deflection signal to at least one deflection electrode corresponding to the selected detecting electrode.

18. The method in claim 17, further comprising: coupling the suppressing signal to the suppressing electrode.

19. The method in claim 18, wherein the suppressing signal is generated by processing the sensed signal with another signal processing circuit, and has inverted phase with the sensed signal.

20. The method in claim 18, wherein the suppressing signal is a predetermined-level signal.

21. The method in claim 16, further comprising: periodically or randomly coupling predetermined-level signals to the sensing electrodes, the deflection electrodes and the suppressing electrode.

* * * * *